(12) United States Patent
Pan

(10) Patent No.: US 6,287,886 B1
(45) Date of Patent: Sep. 11, 2001

(54) METHOD OF FORMING A CMOS IMAGE SENSOR

(75) Inventor: Jui-Hsiang Pan, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/378,698

(22) Filed: Aug. 23, 1999

(51) Int. Cl.⁷ ................................................. H01L 21/00
(52) U.S. Cl. ........................... 438/57; 438/73; 438/200; 257/461; 257/463
(58) Field of Search .................. 438/57, 73, 153; 257/257, 292, 290, 258, 463

(56) References Cited

U.S. PATENT DOCUMENTS

| | | | |
|---|---|---|---|
| 4,107,722 | * 8/1978 | Chamberlain | 357/30 |
| 5,430,321 | * 7/1995 | Effelsberg | 257/463 |
| 5,461,425 | * 10/1995 | Fowler et al. | 384/294 |
| 5,982,011 | * 11/1999 | Kalnitsky et al. | 257/435 |
| 6,051,857 | * 4/2000 | Milda | 257/292 |
| 6,071,826 | * 6/2000 | Cho et al. | 438/723 |
| 6,084,259 | * 7/2000 | Kwon et al. | 257/292 |
| 6,147,372 | * 11/2000 | Yang et al. | 257/232 |

* cited by examiner

*Primary Examiner*—Matthew Smith
*Assistant Examiner*—Belur Keshavan
(74) *Attorney, Agent, or Firm*—Winston Hsu

(57) ABSTRACT

This invention provides a method of forming a CMOS image sensor. The image sensor is formed in a predetermined region of a semiconductor wafer covered with a P-type substrate. The wafer comprises at least one N-channel area for forming one NMOS transistor and a sensor area for forming a photo-diode sensor. At least one gate electrode in the N-channel area is formed first. A first ion-implantation is performed to form a lightly doped drain (LDD) layer in predetermined areas on the surface of the P-type substrate in the N-channel area next to the gate electrode. A second ion-implantation is performed to form a heavy doped drain (HDD) layer in another predetermined area on the surface of the substrate in the N-channel area next to the LDD. A third ion-implantation is performed to form a doped layer with phosphorus as the major dopant on the surface of the substrate in the sensor area. The dopant concentration of the HDD layer is heavier than that of the LDD layer, and the doped layer in the sensor area and the P-type substrate under the doped layer form a PN junction that functions as a photo-diode sensor.

7 Claims, 2 Drawing Sheets

METHOD OF FORMING A CMOS IMAGE SENSOR

BACKGROUND OF THE INVENTION

1. Field of the Invention

The present invention relates to a method of forming a complementary metal-oxide-semiconductor (CMOS) image sensor, and more particularly, to a method of forming an improved photo-diode sensor of an image sensor.

2. Description of the Prior Art

Please refer to FIG. 1 and FIG. 2. FIG. 1 is a top-view diagram of an prior art image sensor on a semiconductor wafer 10. FIG. 2 is a cross sectional diagram along line 2—2 of the semiconductor wafer 10 shown in FIG. 1. A CMOS image sensor comprises three NMOS transistors used as a reset MOS, a current source follower and a raw selector, respectively, and a photo-diode sensor for sensing the photo-intensity. As shown in FIG. 1 and FIG. 2, the image sensor is formed on a semiconductor wafer 10 which is covered with a positive-type (P-type) substrate 12. The surface of the semiconductor wafer 10 comprises a negative-channel (N-channel) area 30 for forming three negative-type MOS (NMOS) transistors and a sensor area 32 for forming a photo-diode sensor. The NMOS transistors in the N-channel area 30 are formed by using a conventional lightly doped drain (LDD) process. In the conventional LDD process, first, a P-type well 13, N-type well, at least one field oxide layer 14 and a gate electrode 16 comprising a conductive layer 18 are formed sequentially. Then, a LDD layers 20 is formed by using an ion-implantation process. Next, spacers 22 are formed. Finally, a heavy doped drain (HDD) layer 24 is formed by using another ion-implantation process with arsenic (As) as the major dopant at a dopant concentration at about $10^{19}$ to $10^{20}$ cm$^{-3}$ so as to complete the NMOS transistors. At the same time, a HDD layer 24 is also formed in the sensor area 32 wherein the HDD layer 24 and the P-type well 13 form a PN junction that functions as a photo-diode sensor.

The HDD layer 24 of the photo-diode sensor and the HDD layer 24 of the NMOS transistors are formed at the same time. That is the HDD layer 24 with heavy As forms one side of the photo-diode sensor. In results, there are many shortcomings in the characteristics of the photo-diode sensor, for examples:

1. The atomic size off As is bigger and the dopant concentration is heavier, so the silicon crystal structure within the surface of the sensor area is destroyed severely which leads to an increase in the leakage current of the PN junction, and an increase in the leakage current (also called dark current) of the PN junction when the photo-diode sensor does not accept light. This will increase the noise of the image sensor and decrease the resolution of the image sensor.
2. The width of the depletion region of the PN junction formed with the HDD layer 24 is narrower which leads to a smaller real active region of the sensor area. This will decrease the leakage current (also called photo-current) of the PN junction when the photo-diode sensor accepts light. Therefore, the sensed photo-signal is smaller and the photo-sensibility is worse.
3. The lifetime of charge carriers (also called photo-charges) simulated in the HDD layer 24 caused by accepting light will decay severely. That is the recombination rate of the photo-charges increases as the dopant concentration of the HDD layer 24 increases which leads to a decrease in the generated current after the acceptance of light. Especially, when a short-wave light such as cyan-light irradiates the semiconductor wafer, the skin depth of the semiconductor wafer is shallower. So the sensitivity to the short-wave light will be much worse as the recombination rate of the photo-charges increases.

SUMMARY OF THE INVENTION

It is therefore a primary objective of the present invention to provide a method of forming an image sensor that can separate the formation of a photo-diode sensor from the formation of a NMOS transistor so as to improve the characteristics of the photodiode sensor.

In a preferred embodiment, the present invention provides a method of forming a complimentary metal-oxide-semiconductor (CMOS) image sensor, the image sensor being formed in a predetermined region of a semiconductor wafer which is covered with a positive-type (P-type) substrate and comprises at least one negative-channel (N-channel) area for forming one negative-type MOS (NMOS) transistor and a sensor area for forming a photo-diode sensor, the method comprising the following steps:

forming at least one gate electrode in the N-channel area;
performing a first ion-implantation process to form a lightly doped drain (LDD) layer in predetermined areas on the surface of the P-type substrate in the N-channel area next to the gate electrode;
performing a second ion-implantation process to form a heavy doped drain (HDD) layer in another predetermined area on the surface of the substrate in the N-channel area next to the LDD; and
performing a third ion-implantation process to form a doped layer with phosphorus as the major dopant on the surface of the substrate in the sensor area;
wherein the dopant concentration of the HDD layer is heavier than that of the LDD layer, and the doped layer in the sensor area and the P-type substrate under the doped layer form a PN junction that functions as a photo-diode sensor.

It is an advantage of the present invention that the destruction issue of the surface crystal within the sensor area can be improved. In addition, the dark-current in the sensor area can be decreased when the photo-diode sensor does not accept light and the photo-current in the sensor area can be increased when the photo-diode sensor accepts light so as to increase the signal to noise ratio (S/N).

This and other objective of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Figure 1:
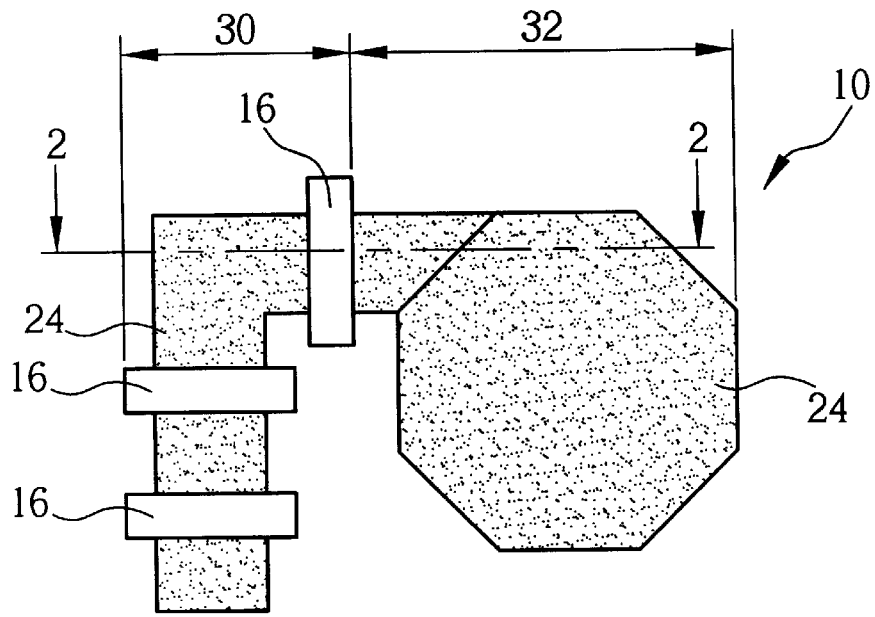
FIG. 1 is a top-view diagram of an image sensor on a semiconductor wafer according to the prior art.
Figure 2:
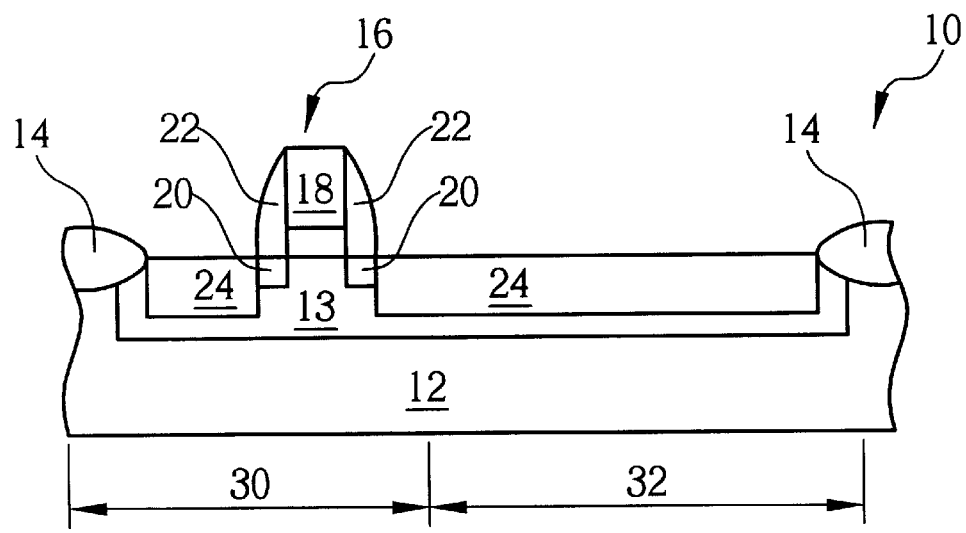
FIG. 2 is a cross sectional diagram along line 2—2 of the semiconductor wafer shown in FIG. 1.
Figure 3:
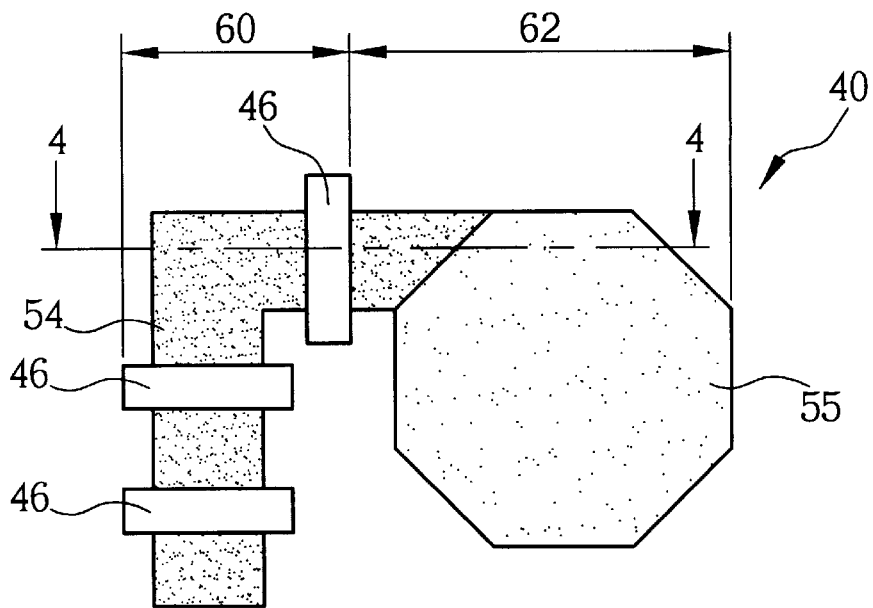
FIG. 3 is a top-view diagram of an image sensor on a semiconductor wafer according to the present invention.
Figure 4:
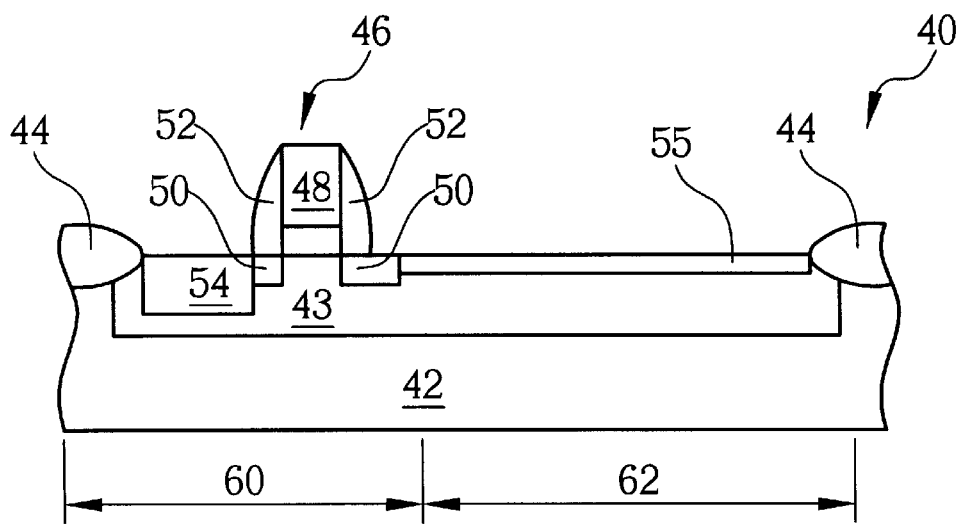
FIG. 4 is a cross sectional diagram along line 4—4 of the semiconductor wafer shown in FIG. 3.

Please refer to FIG. 3 and FIG. 4. FIG. 3 is atop-view diagram of an image sensor on a semiconductor wafer according to the present invention. FIG. 4 is a cross sectional diagram along line 4—4 of the semiconductor wafer shown in FIG. 3. The present invention provides a method of forming a complimentary metal-oxide-semiconductor (CMOS) image sensor in a predetermined region of a semiconductor wafer 40 which is covered with a P-type substrate 42. The semiconductor wafer 40 comprises at least one N-channel area 60 for forming one NMOS transistor, and a sensor area 62 for forming a photo-diode sensor. In the method of the present invention, the formation of the NMOS transistor comprising a LDD structure in the N-channel area 60 proceeds prior to the formation of the photo-diode sensor in the sensor area 62.

As shown in FIG. 3 and FIG. 4, a well formation process is firstly performed to form N-type well and a P-type well 43 on the blanket semiconductor wafer 40. A local oxidation (LOCOS) process is then performed to form a field oxide layer 44 for electrically isolating devices on the semiconductor wafer 40. Next, a plurality of gate electrodes 46 are formed in the N-channel area 60. Each of the gate electrode 46 comprises a conductive layer 48 used as an electrical connection for the gate electrode 46. Afterward, a first ion-implantation process is performed to form a LDD layer 50 in predetermined areas on the surface of the P-type substrate 42 in the N-channel area 60 next to the gate electrode 46. After the formation of the LDD layer 50, a spacer formation process is performed to form two spacers 52 on the side-walls of the gate electrode 46. Next, a second ion-implantation process is performed to form a HDD layer 54 in another predetermined area on the surface of the P-type substrate 42 in the N-channel area 60 next to the LDD layer 50 so as to complete the NMOS transistor. The dopant concentration of the HDD layer 54 is heavier than that of the LDD layer 50.

Following procedures are the formation of the photo-diode sensor. A photolithography process is performed to form a photoresist layer on the semiconductor wafer 40 for covering the N-channel area 60. Then, a third ion-implantation process at an implanting voltage less than 60 KeV is performed to form a doped layer 55 with phosphorus as the major dopant at a concentration of less than $10^{18} cm^{-3}$ on the surface of the P-type substrate 42 in the sensor area 62. The doped layer 55 is formed within a depth of 0.1 $\mu$m from the surface of the P-type substrate 42. Also, the doped layer 55 in the sensor area 62 and the P-type substrate 42 under the doped layer 55 form a PN junction that functions as a photo-diode sensor. Finally, the photoresist layer is removed from the semiconductor wafer 40 so as to complete the image sensor.

The doped layer 55 of the photo-diode sensor is formed by performing the third ion-implantation process at a low dopant concentration and a low implanting voltage. Therefore, the destruction issue of the surface crystal within the sensor area 62 is improved. Also, when the photo-diode sensor does not accept light the dark current of the PN junction is lowered. In addition, the dopant concentration of phosphorus in the doped layer 55 is controlled at less than $10^{18} cm^{-3}$, so the width of the depletion region at the PN junction is increased which leads to an increase in the real active region of the sensor area 62. And, the life time of the photo-charges is increased as the dopant concentration of phosphorus in the doped layer 55 is decreased which leads to an increase in the photo-current of the PN junction when the photo-diode sensor accepts light.

Because the photo-diode sensor is formed by performing the third ion-implantation process at a implanting voltage less than 60 KeV, the doped layer 55 is formed within a depth of 0.1 $\mu$m from the surface of the P-type substrate 42. Because the doped layer 55 is shallower and with a lighter dopant concentration, the depletion region is closer to the surface of the substrate. And hence, when the photo-diode sensor accepts an irradiation by a short-wave light, the sensibility to the short-wave light at the depletion region of the PN junction will increase, and the lifetime of the photo-charges and the concentration of the photo-charges will increase leading to an increase in the photo-current at the real active region of the PN junction. Therefore, in the method according to the present invention, when the photo-diode sensor does not accept light the dark current in the sensor area 62 can be decreased, and when the photo-diode sensor accepts light the photo-current in the sensor area 62 can be increased so as to increase the signal to noise ratio (S/N). This will obviously enhance the sensibility of the image sensor.

Compared to the prior art method of forming the image sensor to form the photo-diode sensor with arsine (As) as the major dopant, in the method of the present invention, the doped layer 55 is formed with phosphorus (P) as the major dopant in the sensor area 62 by performing an ion-implantation process at a low dopant concentration and a low implanting voltage so as to improve the destruction issue of the surface crystal in the sensor area 62. Also, the dark current of the photo-diode sensor in the sensor area 62 is decreased, and the photo-current of the photo-diode sensor in the sensor area 62 is increased, which will increase the signal to noise ratio (S/N). Therefore, the image sensor formed by the method of the present invention possesses very good sensibility.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of forming a negative-type metal oxide-semiconductor (NMOS) in a complimentary metal oxide-semiconductor (CMOS) image sensor, the image sensor being formed in a predetermined region of a semiconductor wafer which is covered with a positive-type (P-type) substrate and comprises at least one negative-channel (N-channel) area for forming one negative-channel (N-channel) for forming one negative-type MOS (NMOS) transistor and a sensor area for forming a photo-diode sensor, the method comprising the following steps:

forming at least one gate electrode in the N-channel area;

performing a first ion-implantation process to form a lightly doped drain (LDD) layer in predetermined areas on the surface of the P-type substrate in the N-channel area next to the gate electrode;

performing a second ion-implantation process to form a heavy doped drain (HDD) layer in another predetermined area on the surface of the substrate in the N-channel area next to the LDD; and performing a third ion-implantation process to form a doped layer with phosphorus as the major dopant on the surface of the substrate in the sensor area;

wherein the dopant concentration of the HDD layer is heavier than that of the LDD layer, and the doped layer in the sensor area and the P-type substrate under the doped layer form a PN junction that functions as a photo-diode.

2. The method of claim 1 wherein the method further comprises a step prior to the formation of the gate electrode in which a field oxide layer is formed to electrically isolate devices on the semiconductor wafer by performing a local oxidation (LOCOS) process.

3. The method of claim 2 wherein the method further comprises a step of performing a well formation process for forming N-type and P-type wells in the semiconductor wafer prior to the formation of the field oxide layer.

4. The method of claim 1 wherein the method further comprises a step in which a spacer formation process is performed to form spacers on the side-walls of the gate electrode after the formation of the LDD layer.

5. The method of claim 1 wherein the major dopant of the doped layer is phosphorous at a concentration of less than $10^{18}$ cm$^{-3}$.

6. The method of claim 1 wherein the implanting voltage of the third ion-implantation process is less than 60 Kev.

7. The method of claim 1 wherein the doped layer is formed within a depth of 0.1 $\mu$m from the surface of the substrate.

* * * * *